United States Patent
Thewes et al.

[11] Patent Number: 6,037,626
[45] Date of Patent: Mar. 14, 2000

[54] SEMICONDUCTOR NEURON WITH VARIABLE INPUT WEIGHTS

[75] Inventors: Roland Thewes, Gröbenzell; Werner Weber, München, both of Germany

[73] Assignee: Siemens Aktiengesellschaft, Munich, Germany

[21] Appl. No.: 09/101,848
[22] PCT Filed: Dec. 18, 1996
[86] PCT No.: PCT/DE96/02449
§ 371 Date: Jul. 17, 1998
§ 102(e) Date: Jul. 17, 1998
[87] PCT Pub. No.: WO97/27632
PCT Pub. Date: Jul. 31, 1997

[30] Foreign Application Priority Data

Jan. 25, 1996 [DE] Germany .................. 196 02 645

[51] Int. Cl.[7] .................. G06F 15/18; H01L 29/788
[52] U.S. Cl. .................. 257/319
[58] Field of Search .................. 257/319; 326/36; 706/33

[56] References Cited

U.S. PATENT DOCUMENTS

| 5,498,888 | 3/1996 | Ozawa | 257/295 |
| 5,587,668 | 12/1996 | Shibata et al. | 326/36 |
| 5,937,399 | 8/1999 | Ohmi et al. | 706/33 |
| 5,973,535 | 10/1999 | Shibata et al. | 327/333 |

FOREIGN PATENT DOCUMENTS

| 0 516 847 A1 | 12/1992 | European Pat. Off. . |
| 0 657 934 A1 | 6/1995 | European Pat. Off. . |
| 0 685 808 A1 | 12/1995 | European Pat. Off. . |

OTHER PUBLICATIONS

IEEE Transactions on Electron Devices, vol. 39, No. 6, Jun. 1992, Tadashi Shibata et al, "A Functional MOS Transistor Featuring Gate–Level Weighted Sum and Threshold Operations," pp. 1444–1455.

IEICE Trans. Electron, vol. E76–C, No. 3, Mar. 1993, Invited Paper, Special Issue on Multiple–Valued Integrated Circuits, T. Shibata et al, "Neuron MOS Voltage–Mode Circuit Technology for Multiple–Valued Logic," pp. 347–356.

IEICE Trans. Electron, vol. E77–C. No. 7, Jul. 1994, Paper, Special Issue on Super Chip for Intelligent Integrated Systems, T. Ohmi et al, "The Concept of Four–Terminal Devices and Its Significance in the Implementation of Intelligent Integrated Circuits", pp. 1032–1041.

*Primary Examiner*—John Guay
*Attorney, Agent, or Firm*—Hill & Simpson

[57] ABSTRACT

A semiconductor neuron has input electrodes are coupled capacitively to a floating gate (FG) whose potential controls the current of a MOS field effect transistor (NT). A respective neuron input (E1 . . . E4) can be connected to partial electrodes (1 . . . 7) of a respective input electrode in such a way that the total surface area of the partial electrodes connected to the respective neuron input corresponds to a respective weight of the neuron input. This results in high processing speed of a hardware neuron with the flexibility of a software neuron.

5 Claims, 2 Drawing Sheets

SEMICONDUCTOR NEURON WITH VARIABLE INPUT WEIGHTS

BACKGROUND OF THE INVENTION

In modern data processing, in particular in video and audio applications, neural networks are playing an increasing role. The fundamental elements of these neural networks are neurons, in which, in the simplest case, a number of inputs act with variable weight on a single output, the signal of the latter respectively assuming a different logic state if the weighted sum of all inputs exceeds or falls below a specific threshold. Neural networks have some similarities with brains, since, in particular, they are capable of learning and the quality of their results can be improved constantly by repeated practice. At present, neurons are for the most part produced using software. However, for faster and more complex applications of neural networks, it is in many cases necessary to implement neurons using hardware, but this has so far raised problems in adaptability to a variety of applications. Applications which are further aspired to, for example in image processing, require very high processing speeds, which in practice can only be achieved using hardware solutions.

IEEE Transactions on Electron Devices, Vol. 39, No. 6, June 1992, pages 1444 to 1454, has already disclosed a component which, with a very small surface area, has important partial functions, for example the logical coupling of a plurality of inputs, and the formation of a threshold value. A disadvantage in this case is that the individual inputs cannot be weighted differently, or that the weighting of the inputs cannot be altered flexibly.

European patent applications 0 685 808 A and 0 657 934 A respectively disclose a semiconductor neuron, whereby an input electrode comprising a plurality of sub-electrodes is capacitatively coupled to a floating gate, whereby the inputs of the semiconductor neuron can be connected to a plurality of sub-electrodes, so that, for the overall area of these inputs, the weightings of all neuron inputs can be modified. In FIG. 8 of the 0 685 808 A application, for example, the input Ci-1 is connected to two electrodes of the two last stages, whereas the two other signal inputs are only respectively connected to one electrode. In FIG. 1c of the 0 657 934 A application, for example, the input electrodes A1–A3 are connected to one another, whereas the input electrodes C1–C4 are connected to one another.

SUMMARY OF THE INVENTION

The object of the invention is therefore to provide a semiconductor neuron and a corresponding drive, such that the semiconductor neuron, with a small chip area and a high processing speed, permits variable weighting of the inputs.

In general terms the present invention is a semiconductor neuron, in which at least one input electrode, consisting of a plurality of partial electrodes, is coupled capacitively for signal transmission to a floating gate whose potential controls the current of a MOS field effect transistor. A respective neuron input can be connected to partial electrodes of the plurality of partial electrodes such that the total surface area of the partial electrodes connected to the respective neuron input corresponds to a respective weight of the neuron input. Sub-electrodes of the input electrodes are connected to neuron inputs via multiplexers.

Advantageous developments of this embodiment of the present invention are as follows.

Partial electrodes of a respective neuron have different electrode surface areas.

A respective neuron is driven by a respective control circuit, all control circuits being supplied from a single controller with addresses, data and a clock signal.

A respective control circuit connected to a respective neuron is equipped with an address decoder, a data connection unit, a clock connection unit and a shift register. It is possible for the data and the clock signal to be fed as a function of the address to the shift register which, for its part, produces control signals for the multiplexers of a respective neuron.

The respective control circuit is supplied by the controller with addresses and data in such a way that the total surface area of all partial electrodes connected to neuron inputs of a respective neuron is, for arbitrary weighting of the neuron inputs, always the same size as the total surface area of all partial electrodes of the respective neuron.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
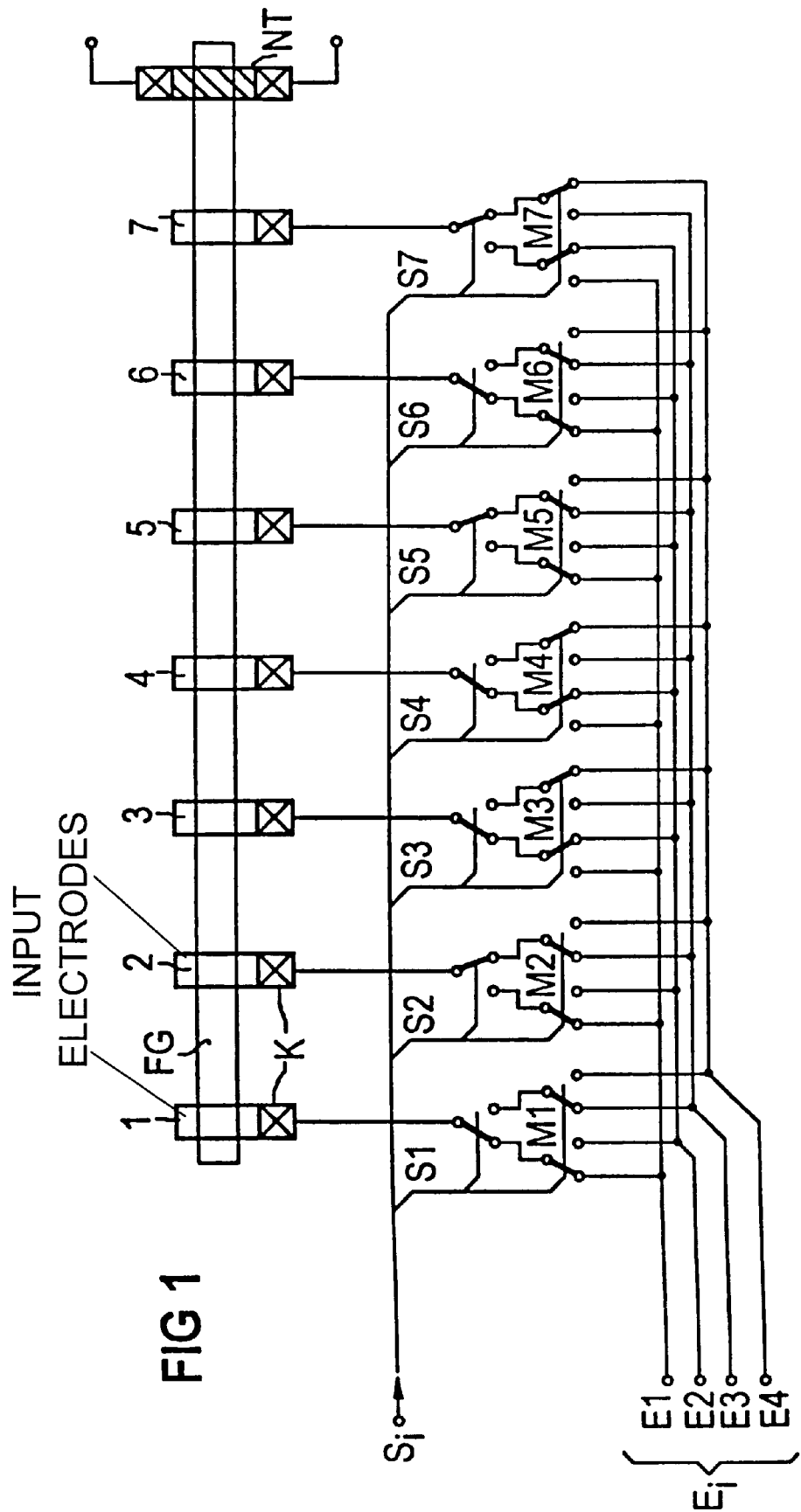
FIG. 1 shows a block circuit diagram of the semiconductor neuron according to the invention.

FIG. 1 shows a block circuit diagram of a semiconductor neuron according to the invention which has a MOS field effect transistor NT with a floating gate FG, the floating gate representing a common mating electrode of input capacitors which are respectively formed by the mating electrode and respective partial electrodes 1 . . . 7. The choice of the number of partial electrodes is in this case virtually arbitrary. The floating gate is in this case formed, for example, by a first polysilicon layer which is electrically insulated from a semiconductor substrate and from the partial electrodes by an oxide layer. The partial electrodes may in this case be fabricated in a second overlying polysilicon layer and electrically connected via contact holes K. A respective partial electrode 1 . . . 7 is connected to an output of a respective associated multiplexer M1 . . . M7. The inputs of each multiplexer are connected with neuron inputs $E_i$ or E1 . . . E4, and the respective multiplexer in each case connects always exactly one neuron input to one partial electrode. The number of inputs is virtually arbitrary, but is expediently substantially less than the number of partial electrodes. The multiplexers M1 . . . M7 are driven by control signals $S_i$ or S1 . . . S7, which are formed in a control circuit and which, depending on the number of neuron inputs, may be one or even more bits wide.

In the example shows in FIG. 1, seven partial electrodes and four neuron inputs E1 . . . E4 are provided, the electrodes 1 and 6 being connected to the neuron input E1, the electrodes 2 and 5 being connected to the neuron input E3, with the electrodes 3 and 4 being connected to the neuron input E2 and the single input electrode 7 being connected to the neuron input E4 by means of the multiplexers M1 . . . M7. This has the result that, insofar as the electrodes 1 . . . 7 all have the same surface area, the neuron inputs E1, E2 and E3 are evaluated with twice the weight of the neuron input E4, since in relation with these neuron inputs, the capacitor surface and therefore the coupling capacitor is doubled in comparison with the coupling capacitance of the neuron input E4.

It is, however, possible for the individual electrodes to have different dimensions from one another, and therefore inherently have a different weight. If, for example, the weights for the input electrodes 1 . . . 3 have a weight of 1, the input electrodes 4 and 5 have a weight of 2, the input electrode 6 has a weight of 3 and the input electrode 7 has a weight of 4, then it is possible to have a more refined gradation in terms of the distribution of the weights over the inputs than with an arrangement with equal electrode dimensions. With the indicated distribution of the weights of the input electrodes and the switch position for the multiplexers according to FIG. 1, the input E1 then receives a weight of 1+3=4, input E2 receives a weight of 1+2=3, input E3 receives a weight of 1+2=3 and input E4 receives a weight of 4.

In order to make full use of the available hardware, it is advantageous if, in each case, the total surface area of all partial electrodes directly connected to neuron inputs is, for an arbitrary weighting of the neuron inputs, always the same size as the total surface area of all the partial electrodes actually present.

Figure 2:
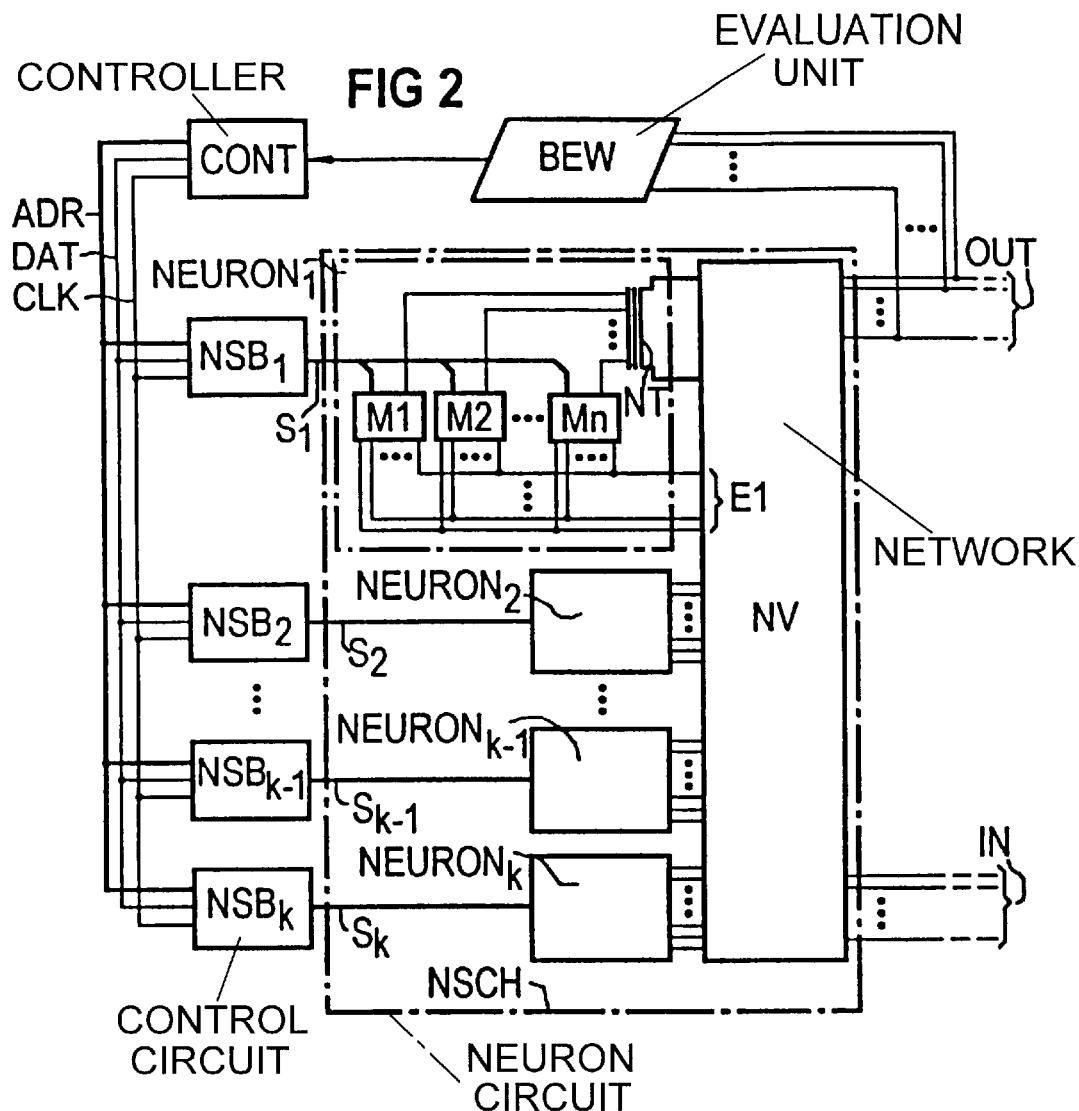
FIG. 2 shows a block circuit diagram of a circuit with a plurality of semiconductor neurons according to the invention and control circuits as well as further peripherals.

FIG. 2 shows, by way of example, a schematic representation of a neuron circuit NSCH with k neurons $NEURON_1$ . . . $NEURON_k$. These neurons are interlinked via a network NV which also connects input signals IN and output signals OUT of the neuron circuit NSCH in the desired form with the neurons. Outside the signal processing neuron circuit NSCH there are k control circuits $NSB_1$ . . . $NSB_k$ for forming control signals $S_i$ . . . $S_k$ for controlling the multiplexers of the respective neurons, without it being necessarily required for the neurons of the circuit NSCH to be configured identically in terms of the number of their inputs, the number of their input electrodes or the number of their multiplexers and the distribution of the available weights. The control circuits $NSB_1$ . . . $NSB_k$ are connected to a single controller CONT, each of the control circuits being addressable individually by the controller via its own address ADR, and it being possible for data DAT for setting the multiplexers M1 . . . Mn of the respective neuron to be sent to the respectively addressed control circuit.

In order to explain the mode of operation, it will firstly be presupposed that all the neurons of the circuit NSCH have a particular state in terms of the distribution of the weights of the partial electrodes over the inputs. This state, as well as the configuration of all the neurons, that is to say the number of their input electrodes together with the associated weights and the number of inputs, are known to the controller CONT. During the learning phase of the neuron circuit NSCH, the neuron circuit NSCH produces a particular output signal OUT when a particular input signal IN is applied. This output signal OUT is evaluated by an evaluation unit BEW, it being possible for this evaluation unit to be produced as hardware on the same chip, but this is not absolutely necessary. The evaluation t communicates the result of the evaluation of the output signal to the controller CONT. In the case of an unsatisfactory result, this controller will, because of its knowledge of the state and the configuration of the neurons, calculate a new state and forward the requisite data to the control circuits $NSB_1$ . . . $NSB_k$. An advantage with this configuration of the overall circuit consisting of the neuron circuit NSCH, the controller CONT and the control circuits NSB, is, as shown in FIG. 3, that it is possible to produce a control circuit NSB with comparatively little outlay and requirement for space, and that only at one point in the overall circuit is it necessary to have a single, central intelligent unit for calculating the states to be set for the neurons, namely the controller CONT.

Figure 3:
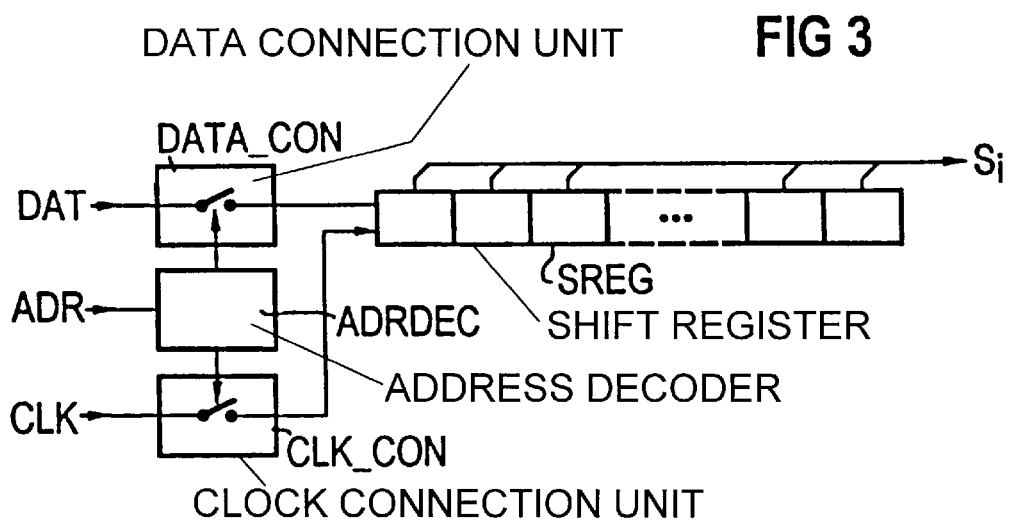
FIG. 3 shows a circuit diagram of a control circuit in FIG. 2.

By way of example, FIG. 3 shows a control circuit with an address decoder ADRDEC, a data connection unit DATA_CON, a clock connection unit CLK_CON and a shift register SREG with latches, it being possible for the data DAT and a clock signal CLK which comes from the controller CONT to be fed as a function of the address ADR to the shift register which, for its part, produces the control signals $S_i$ for the multiplexers of a respective neuron. The number of stages, and therefore also the number of outputs of the shift register, is equal to the number of bits needed for fully controlling the multiplexers of a neuron. The parallel outputs of the shift register form the drive signals for the multiplexers of a neuron.

In the case of the neuron according to FIG. 1, a 14-stage shift register would thus be necessary. In order to write data to the individual stages of the shift register, it is necessary for a one bit wide data input of the shift register to be supplied with a datum which is transferred to the first stage on triggering by the clock signal CLK. On further triggering of the shift register, this datum is transferred into the following stage while the datum currently available at the data input is read into the first stage, and so on.

The data and clock inputs of a shift register respectively belonging to a control circuit NSB are, however, only enabled so long as the controller CONT has chosen that address on the address line which coincides with the address of the address decoder of the corresponding circuit NSB. Advantages with a structure of this type for a control circuit NSB are, on the one hand, that the outlay on circuitry is kept within tolerable limits and, on the other hand, the number of lines for connecting the controller CONT to the control circuits $NSB_1$ . . . $NSB_{k2}$ is not excessive.

The invention is not limited to the particular details of the apparatus depicted and other modififcations and applications are contemplated. Certain other changes may be made in the above described apparatus without departing from the true spirit and scope of the invention herein involved. It is intended, therefore, that the subject matter in the above depiction shall be interpeted as illustrative and not in a limiting sense.

What is claimed is:

1. A semiconductor neuron, comprising:
    at least one input electrode, consisting of a plurality of partial electrodes, coupled capacitively for signal transmission to a floating gate whose potential controls a current of a MOS field effect transistor;
    a respective neuron input being connectable to partial electrodes of the plurality of partial electrodes such that a total surface area of the partial eltrodes connected to the respective neuron input corresponds to a respective weight of the respective neuron input, and whereby sub-electrodes of the input electrodes are connected to neuron inputs via multiplexers.

2. The semiconductor neuron according to claim 1, wherein partial electrodes of a respective neuron have different electrode surface areas.

3. The semiconductor neuron as claimed in claim 1, wherein a respective neuron is driven by a respective control circuit of a plurality of control circuits, all control circuits of the plurality of control circuits being supplied from a single controller with addresses, data and a clock signal.

4. The semiconductor neuron as claimed in claim 3, wherein a respective control circuit connected to a respective neuron is equipped with an address decoder, a data connection unit, a clock connection unit and a shift register, the data and the clock signal being suppliable as a function of the address to the shift register which produces control signals for the multiplexers of a respective neuron.

5. The semiconductor neuron as claimed in claim 3, wherein the respective control circuit is supplied by the controller with addresses and data such that a total surface area of all partial electrodes connected to neuron inputs of a respective neuron is, for arbitrary weighting of the neuron inputs, always a same size as the total surface area of all partial electrodes of the respective neuron.

* * * * *